(12) United States Patent
Hanashima et al.

(10) Patent No.: US 10,388,512 B2
(45) Date of Patent: Aug. 20, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takeo Hanashima, Toyama (JP); Takafumi Sasaki, Toyama (JP); Hiroaki Hiramatsu, Toyama (JP); Tsukasa Kamakura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/826,252

(22) Filed: Nov. 29, 2017

(65) Prior Publication Data

US 2018/0151347 A1    May 31, 2018

(30) Foreign Application Priority Data

Nov. 30, 2016 (JP) .................................. 2016-232002

(51) Int. Cl.
*H01L 21/02* (2006.01)
*C23C 16/455* (2006.01)
*C23C 16/52* (2006.01)
*C23C 16/34* (2006.01)

(52) U.S. Cl.
CPC ........ *H01L 21/0228* (2013.01); *C23C 16/345* (2013.01); *C23C 16/45523* (2013.01); *C23C 16/45527* (2013.01); *C23C 16/45544* (2013.01); *C23C 16/45563* (2013.01); *C23C 16/45574* (2013.01); *C23C 16/52* (2013.01); *H01L 21/0217* (2013.01)

(58) Field of Classification Search
CPC ........... H01L 21/0228; H01L 21/02211; H01L 21/67109; H01L 21/02164; H01L 21/67017
See application file for complete search history.

(56) References Cited

U.S. PATENT DOCUMENTS

2009/0197424 A1   8/2009 Sakai et al.
2014/0256156 A1* 9/2014 Harada ............. H01L 21/67017
                                                           438/778

FOREIGN PATENT DOCUMENTS

JP         2010-118462 A        5/2010

* cited by examiner

*Primary Examiner* — Tony Tran
(74) *Attorney, Agent, or Firm* — Volpe and Koenig, P.C.

(57) ABSTRACT

A method of manufacturing a semiconductor device includes forming a film on a substrate by performing a cycle a predetermined number of times. The cycle includes non-simultaneously performing (a) forming a first layer by supplying a precursor to the substrate from a first nozzle and (b) forming a second layer by supplying a reactant to the substrate from a second nozzle different from the first nozzle to thereby modify the first layer. The act (a) includes sequentially performing (a-1) supplying an inert gas from the second nozzle at a first flow rate smaller than a flow rate of the precursor in a state in which the precursor is supplied from the first nozzle and (a-2) supplying an inert gas from the second nozzle at a second flow rate larger than the flow rate of the precursor in a state in which the precursor is supplied from the first nozzle.

8 Claims, 11 Drawing Sheets

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2016-232002, filed on Nov. 30, 2016, the entire contents of which are incorporated herein by reference.

TECHNICAL FIELD

The present disclosure relates to a method of manufacturing a semiconductor device, a substrate processing apparatus, and a recording medium.

BACKGROUND

As one process of manufacturing a semiconductor device, a process of forming a film on a substrate may be performed.

SUMMARY

Some embodiments of the present disclosure provide a technique capable of controlling the in-plane film thickness distribution of a film formed on a substrate.

According to one embodiment of the present disclosure, there is provided a method of manufacturing a semiconductor device including forming a film on a substrate by performing a cycle a predetermined number of times, the cycle including non-simultaneously performing: (a) forming a first layer by supplying a precursor to the substrate from a first nozzle; and (b) forming a second layer by supplying a reactant to the substrate from a second nozzle different from the first nozzle to thereby modify the first layer. The act (a) includes sequentially performing (a-1) supplying an inert gas from the second nozzle at a first flow rate smaller than a flow rate of the precursor in a state in which the precursor is supplied from the first nozzle and (a-2) supplying an inert gas from the second nozzle at a second flow rate larger than the flow rate of the precursor in a state in which the precursor is supplied from the first nozzle.

DETAILED DESCRIPTION

Figure 1:
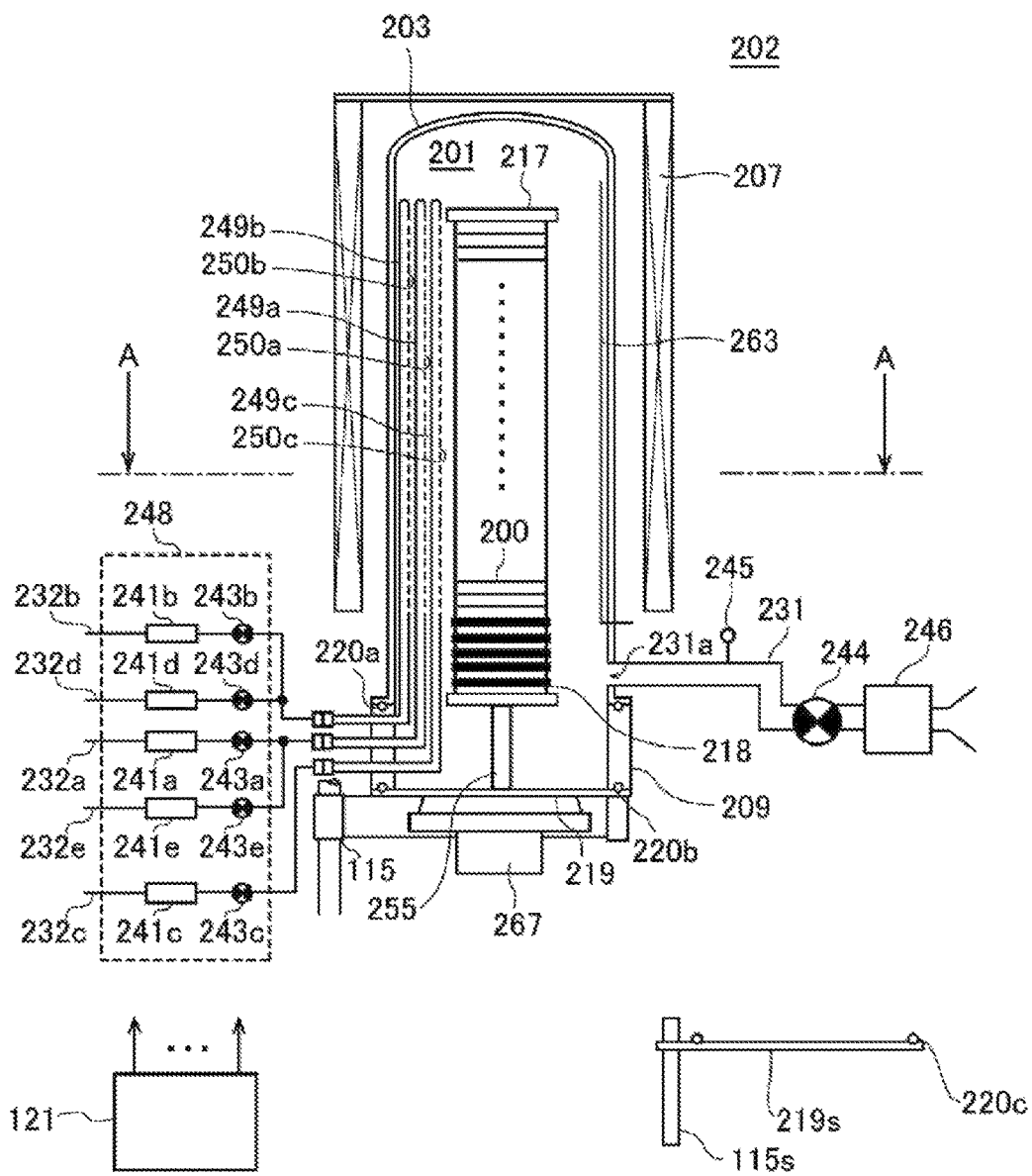
FIG. 1 is a schematic configuration diagram of a vertical processing furnace of a substrate processing apparatus suitably used in an embodiment of the present disclosure, in which in which a part of the processing furnace is shown in a vertical sectional view.

Embodiments of the present disclosure will be now described in detail with reference to the drawings. Like or equivalent components, members, and processes illustrated in each of the drawings are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

One Embodiment of the Present Disclosure

An embodiment of the present disclosure will now be described with reference to FIGS. 1 to 3.

(1) Configuration of Substrate Processing Apparatus

As shown in FIG. 1, a processing furnace 202 includes a heater 207 as a heating means (heating mechanism). The heater 207 has a cylindrical shape and is supported by a holding plate so as to be vertically installed. The heater 207 also functions as an activation mechanism (excitation unit) that thermally activates (excites) a gas.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with its upper end closed and its lower end opened. Under the reaction tube 203, a manifold 209 is disposed concentrically with the reaction tube 203. The manifold 209 is made of a metal such as, for example, stainless steel (SUS) or the like and is formed in a cylindrical shape with its upper and lower ends opened. The upper end portion of the manifold 209 is engaged with the lower end portion of the reaction tube 203 and is configured to support the reaction tube 203. An O-ring 220*a* as a seal member is provided between the manifold 209 and the reaction tube 203. The reaction tube 203 is vertically installed just like the heater 207. A processing vessel (reaction vessel) is mainly formed of the reaction tube 203 and the manifold 209. A process chamber 201 is formed in the hollow portion of the processing vessel. The process chamber 201 is configured to be able to accommodate wafers 200 as substrates.

In the process chamber 201, a nozzle 249*a* as a first nozzle and nozzles 249*b* and 249*c* as second nozzles are provided so as to penetrate the side wall of the manifold 209. Gas supply pipes 232*a* to 232*c* are connected to the nozzles 249*a* to 249*c*, respectively. The second nozzles are different from the first nozzle. The nozzles 249*a*, 249*b* and 249*c* are different nozzles.

Mass flow controllers (MFC) 241*a* to 241*c* as flow rate controllers (flow rate control parts) and valves 243*a* to 243*c* as opening/closing valves are provided in the gas supply pipes 232a to 232c in order from the upstream side of a gas flow. Gas supply pipes 232e and 232d for supplying an inert gas are connected to the gas supply pipes 232a and 232b, respectively, on the downstream side of the valves 243a and 243b. MFCs 241e and 241d and valves 243e and 243d are provided in the gas supply pipes 232e and 232d in order from the upstream side of a gas flow.

Figure 2:
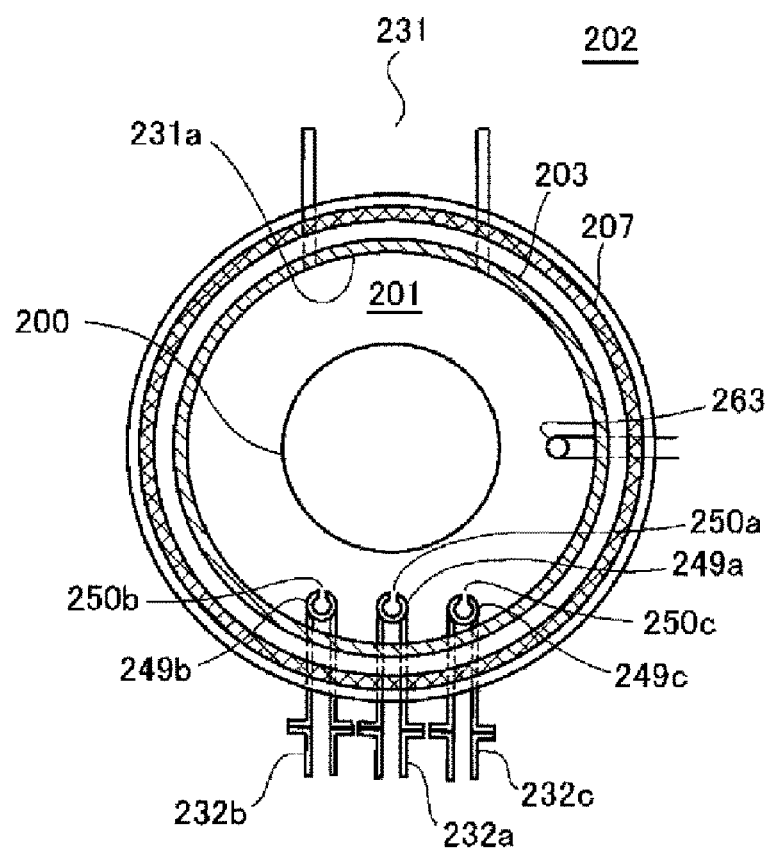
FIG. 2 is a schematic configuration diagram of a part of a vertical processing furnace of a substrate processing apparatus suitably used in an embodiment of the present disclosure, in which a part of the processing furnace is shown in a sectional view taken along line A-A in FIG. 1.

As shown in FIG. 2, the nozzles 249a to 249c are arranged in an annular space in a plan view between the inner wall of the reaction tube 203 and the wafers 200 and are provided so as to extend upward in the arrangement direction of the wafers 200 from the lower portion of the inner wall of the reaction tube 203 to the upper portion thereof. In other words, the nozzles 249a to 249c are respectively provided in a region existing on the side of a wafer arrangement region, in which the wafers 200 are arranged, and horizontally surrounding the wafer arrangement region, so as to extend along the wafer arrangement region. In a plan view, the nozzle 249a is disposed so as to face an exhaust port 231a, which will be described later, on a straight line across the centers of the wafers 200 loaded into the process chamber 201. The nozzles 249b and 249c are arranged on both sides of the nozzle 249a interposed therebetween. That is to say, the nozzles 249b and 249c are arranged on both sides of the nozzle 249a interposed therebetween along the inner wall of the reaction tube 203 (the outer peripheries of the wafers 200). Gas supply holes 250a to 250c for supplying gases are provided on the side surfaces of the nozzles 249a to 249c, respectively. The respective gas supply holes 250a to 250c are opened so as to face the exhaust port 231a and are configured to be possible to supply gases toward the wafers 200. The gas supply holes 250a to 250c are provided in a plural number from the lower portion to the upper portion of the reaction tube 203.

A precursor (precursor gas), for example, a halosilane-based gas containing Si as a predetermined element (main element) and a halogen element is introduced from the gas supply pipe 232a into the process chamber 201 via the MFC 241a, the valve 243a and the nozzle 249a. The precursor gas refers to a precursor in a gaseous state, for example, a gas obtained by vaporizing a precursor staying in a liquid state under room temperature and atmospheric pressure, a precursor staying in a gaseous state under room temperature and atmospheric pressure, or the like. Halosilane refers to a silane having halogen groups. Halogen groups include a chloro group, a fluoro group, a bromo group, an iodo group, and the like. That is to say, halogen groups include halogen elements such as chlorine (Cl), fluorine (F), bromine (Br), iodine (I), and the like. As the halosilane-based gas, for example, a precursor gas containing Si and Cl, namely a chlorosilane-based gas may be used. The chlorosilane-based gas acts as a Si source. As the chlorosilane-based gas, for example, a dichlorosilane ($SiH_2Cl_2$, abbreviation: DCS) gas may be used.

A reactant having a chemical structure (molecular structure) different from that of the precursor, for example, a hydrogen-nitride-based gas which is a nitriding gas as a nitrogen (N)-containing gas, is supplied from the gas supply pipe 232b into the process chamber 201 via the MFC 241b, the valve 243b and the nozzle 249b. The hydrogen-nitride-based gas acts as an N source. For example, an ammonia ($NH_3$) gas may be used as the hydrogen-nitride-based gas.

An inert gas, for example, a nitrogen ($N_2$) gas is supplied from the gas supply pipes 232c to 232e into the process chamber 201 via the MFCs 241c to 241e, the valves 243c to 243e, the gas supply pipes 232c to 232a, and the nozzles 249c to 249a. The $N_2$ gas acts as a purge gas or a carrier gas and further acts as a film thickness distribution control gas for controlling the in-plane film thickness distribution of the films formed on the wafers 200.

A precursor supply system is mainly formed of the gas supply pipe 232a, the MFC 241a and the valve 243a. Further, a reactant supply system is mainly formed of the gas supply pipe 232b, the MFC 241b and the valve 243b. In addition, an inert gas supply system is mainly formed of the gas supply pipes 232c to 232e, the MFCs 241c to 241e and the valves 243c to 243e.

One or all of the above-mentioned various supply systems may be configured as an integrated supply system 248 formed by integrating the valves 243a to 243e, the MFCs 241a to 241e and the like. The integrated supply system 248 are connected to each of the gas supply pipes 232a to 232e and are configured such that the supply operations of the various gases to the gas supply pipes 232a to 232e, i.e., the opening/closing operation of the valves 243a to 243e, the flow rate adjusting operation of the MFCs 241a to 241e, and the like can be controlled by a controller 121 which will be described later. The integrated supply system 248 is configured integrally or with split-type integrated units. The integrated supply system 248 may be configured to be attachable from the gas supply pipes 232a to 232e or the like on an integrated unit basis. The maintenance, replacement, expansion or the like of the integrated supply system 248 may be performed on an integrated unit basis.

An exhaust port 231a for exhausting the atmosphere inside the process chamber 201 is provided in the reaction tube 203. As shown in FIG. 2, the exhaust port 231a is provided at a position opposite to (facing) the nozzles 249a, 249b and 249c (gas supply holes 250a, 250b and 250c) across the wafers 200 in a plan view. An exhaust pipe 231 is connected to the exhaust port 231a. A vacuum pump 246 as a vacuum exhaust device is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The vacuum exhaust and the vacuum exhaust stop of the interior of the process chamber 201 can be performed by opening and closing APC valve 244 in a state in which the vacuum pump 246 is operated, and the pressure inside the process chamber 201 can be adjusted by adjusting the valve opening degree based on the pressure information detected by the pressure sensor 245 in a state in which the vacuum pump 246 is operated. An exhaust system is mainly formed of the exhaust pipe 231, the APC valve 244 and the pressure sensor 245. The vacuum pump 246 may be included in the exhaust system.

A seal cap 219 as a furnace opening port lid capable of airtightly closing the lower end opening of the manifold 209 is provided below the manifold 209. The seal cap 219 is made of a metal such as, for example, SUS or the like and is formed in a disc shape. On the upper surface of the seal cap 219, there is provided an O ring 220b as a seal member which makes contact with the lower end of the manifold 209. Below the seal cap 219, there is installed a rotation mechanism 267 for rotating a boat 217 to be described later. A rotating shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising and lowering the seal cap 219. Under the manifold 209, there is provided a shutter 219s as a furnace opening capable of airtightly closing the lower end opening of the manifold 209 in a state in which the seal cap 219 is lowered to unload the boat 217 from the process chamber 201. The shutter 219s is made of a metal such as, for example, SUS, and is formed in a disk shape. On the upper surface of the shutter 219s, there is provided an O-ring 220c as a seal member which makes contact with the lower end of the manifold 209. The opening and closing operations (the elevating operation, the rotating operation and the like) of the shutter 219s are controlled by a shutter opening/closing mechanism 115s.

The boat 217 as a substrate support is configured so as to support a plurality of wafers 200, for example, 25 to 200 wafers 200 at multiple stages in a horizontal posture and in a vertically-aligned state with their centers aligned with one another, namely so as to arrange the wafers 200 at intervals. The boat 217 is made of a heat-resistant material such as, for example, quartz or SiC. Heat insulating plates 218 made of a heat resistant material such as, for example, quartz or SiC are disposed at multiple stages in the lower portion of the boat 217.

In the reaction tube 203, there is installed a temperature sensor 263 as a temperature detector. By adjusting the degree of power supply to the heater 207 based on the temperature information detected by the temperature sensor 263, the temperature inside the process chamber 201 is controlled to have a desired temperature distribution. The temperature sensor 263 is provided along the inner wall of the reaction tube 203.

Figure 3:
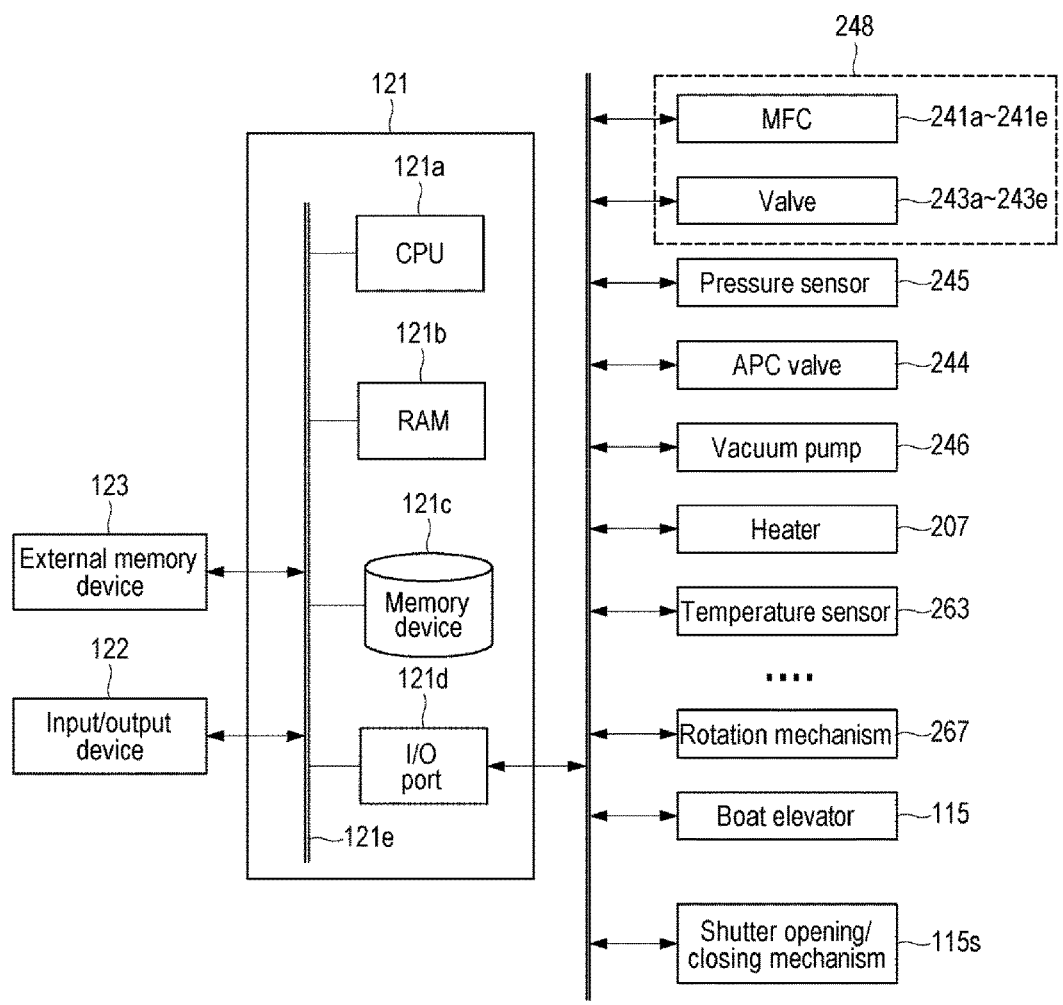
FIG. 3 is a schematic configuration diagram of a controller of a substrate processing apparatus suitably used in an embodiment of the present disclosure, in which a control system of a controller is shown in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c, and the I/O port 121d are configured to exchange data with the CPU 121a via an internal bus 121e. An input/output device 122 formed of, for example, a touch panel or the like is connected to the controller 121.

The memory device 121c is configured with, for example, a flash memory, a hard disc drive (HDD), or the like. A control program for controlling the operations of the substrate processing apparatus, a process recipe in which sequences and conditions of a substrate processing process to be described later are written, or the like is readably stored in the memory device 121c. The process recipe functions as a program for causing the controller 121 to execute each sequence in the substrate processing process, which will be described later, to obtain a predetermined result. Hereinafter, the process recipe and the control program will be generally and simply referred to as a "program". When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory device 121c and execute the same. The CPU 121a is also configured to read the process recipe from the memory device 121c according to an input of an operation command from the input/output device 122. The CPU 121a is configured to control, according to the contents of the read process recipe, the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operations of rotating the boat 217 with the rotation mechanism 267 and adjusting the rotation speed of the boat 217, the operation of moving the boat 217 up and down with the boat elevator 115, the opening/closing operation of the shutter 219s by the shutter opening/closing mechanism 115s, and the like.

The controller 121 may be configured by installing, on a computer, the aforementioned program stored in an external memory device (for example, a magnetic tape, a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured with a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Film Forming Process

A sequence example of forming a silicon nitride film (SiN film) on a wafer 200 as a substrate using the aforementioned substrate processing apparatus, which is one of the processes for manufacturing a semiconductor device, will be described below with reference to FIG. 4. In the following descriptions, the operations of the respective parts that constitute the substrate processing apparatus are controlled by the controller 121.

Figure 4:
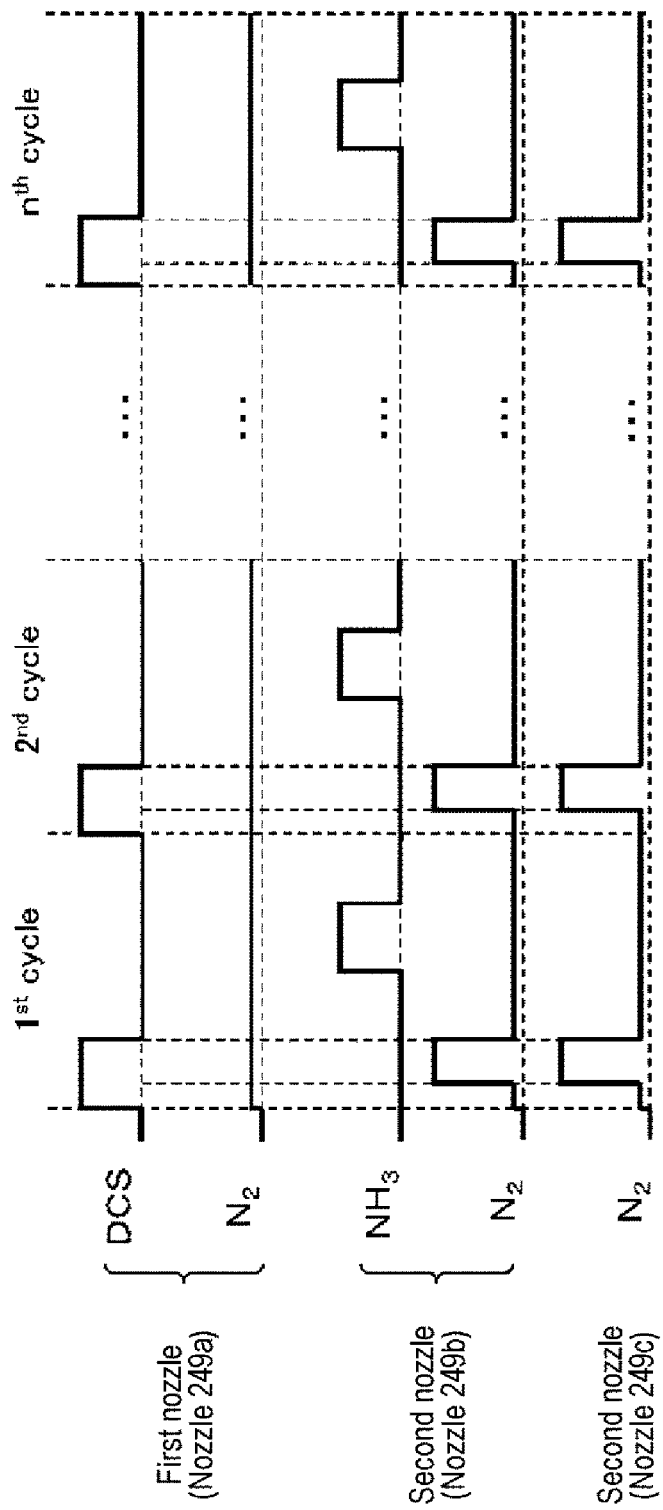
FIG. 4 is a diagram showing a film forming sequence according to an embodiment of the present disclosure.

In a film forming sequence shown in FIG. 4, a film containing Si and N, namely a SiN film, is formed on a wafer 200 by performing, a predetermined number of times, a cycle which non-simultaneously performs: step A of forming a Si-containing layer as a first layer by supplying a DCS gas to the wafer 200 from the nozzle 249a; and step B of forming a silicon nitride layer (SiN layer) as a second layer by supplying an NH$_3$ gas to the wafer 200 from the nozzle 249b.

Further, in the film forming sequence shown in FIG. 4, the step A is performed by step A1 of supplying an N$_2$ gas from the nozzles 249b and 249c at a first flow rate smaller than a flow rate of the DCS gas in a state in which the DCS gas is supplied from the nozzle 249a, and step A2 of supplying the N$_2$ gas from the nozzles 249b and 249c at a second flow rate larger than the flow rate of the DCS gas in a state in which the DCS gas is supplied from the nozzle 249a, sequentially, so that the in-plane film thickness distribution of the SiN film formed on the wafer 200 (hereinafter also simply referred to as in-plane film thickness distribution) is controlled.

As an example, description will be made on an example in which a bare wafer having a small surface area with no concavo-convex structure formed on its surface is used and the flow rate of the $N_2$ gas supplied through the nozzles 249b and 249c in steps A1 and A2 is controlled, so that the in-plane film thickness distribution of the SiN film is set to a distribution in which the film thickness is largest in a central portion of the wafer 200 and is gradually reduced toward a peripheral edge portion of the wafer 200 (hereinafter also referred to as center convex distribution). If it is possible to form the film having the center convex distribution on the bare wafer, a film having a flat film thickness distribution (hereinafter also referred to as a flat distribution) with a small change in film thickness from the center to the periphery can be formed on a pattern wafer (product wafer) having a large surface area with a fine concavo-convex structure formed on its surface.

In this specification, the film forming sequence shown in FIG. 4 may be denoted as follows for the sake of convenience. The same notation is also used in the following description of modifications and the like.

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the expression "a predetermined layer is formed on a wafer" as used herein may mean that "a predetermined layer is directly formed on a surface of a wafer itself" or that "a predetermined layer is formed on a layer or the like formed on a wafer." In addition, when the term "substrate" is used herein, it may be synonymous with the term "wafer."

(Wafer Charging and Boat Loading)

When a plurality of wafers 200 is charged on the boat 217 (wafer charging), the shutter 219s is moved by the shutter opening/closing mechanism 115s to open the lower end opening of the manifold 209 (shutter open). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 exist, is vacuum-exhausted (depressurization-exhausted) by the vacuum pump 246 so as to reach a desired pressure (degree of vacuum). At this time, the pressure in the process chamber 201 is measured by the pressure sensor 245. The APC valve 244 is feedback-controlled based on the measured pressure information. The wafers 200 in the process chamber 201 are heated by the heater 207 to a desired temperature. At this time, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the process chamber 201 and the heating and rotation of the wafers 200 may be continuously performed at least until the processing of the wafers 200 is completed.

(Film Forming Step)

Thereafter, the following steps A and B are sequentially executed.

[Step A]

In this step, a DCS gas is supplied to the wafers 200 in the process chamber 201.

Specifically, the valve 243a is opened to allow the DCS gas to flow into the gas supply pipe 232a. The flow rate of the DCS gas is adjusted by the MFC 241a. The DCS gas is supplied into the process chamber 201 via the nozzle 249a and is exhausted from the exhaust port 231a. At this time, the DCS gas is supplied to the wafers 200. At the same time, the valve 243e may be opened to allow an $N_2$ gas to flow into the gas supply pipe 232e. The flow rate of the $N_2$ gas is adjusted by the MFC 241e. The $N_2$ gas is supplied together with the DCS gas into the process chamber 201 via the nozzle 249a and is exhausted from the exhaust port 231a. In step A, steps A1 and A2 of supplying an $N_2$ gas into the process chamber 201 through the nozzles 249b and 249c are performed in a state in which the DCS gas is supplied into the process chamber 201 through the nozzle 249a. Details of steps A1 and A2 will be described later.

In step A, the supply flow rate of the DCS gas supplied from the nozzle 249a is set to a predetermined flow rate within a range of, for example, 1 to 2000 sccm, desirably 10 to 1000 sccm. The supply flow rate of the $N_2$ gas supplied from the nozzle 249a is set to a predetermined flow rate within a range of, for example, 0 to 1000 sccm. The supply time of the DCS gas is set to a predetermined time within a range of, for example, 1 to 120 seconds, desirably 1 to 60 seconds. The pressure in the process chamber 201 is set to a predetermined pressure within a range of, for example, 1 to 2666 Pa, desirably 67 to 1333 Pa. The temperature of the wafer 200 (film forming temperature) is set to a predetermined temperature within the range of, for example, 250 to 800 degrees C., desirably 400 to 750 degrees C., more desirably 550 to 700 degrees C.

When the film forming temperature is lower than 250 degrees C., it is difficult to chemisorb the DCS on the wafer 200. Thus, a practical film formation rate may not be obtained in some cases. By setting the film forming temperature to 250 degrees C. or higher, it is possible to resolve this problem. By setting the film forming temperature to 400 degrees C. or higher, more desirably 550 degrees C. or higher, it is possible to sufficiently adsorb the DCS on the wafer 200. Thus, a sufficient film formation rate can be obtained.

When the film forming temperature exceeds 800 degrees C., an excessive gas phase reaction is generated. Thus, the film thickness uniformity tends to deteriorate and the control of the film thickness uniformity becomes difficult. By setting the film forming temperature to 800 degrees C. or lower, it is possible to generate an appropriate gas phase reaction. This makes it possible to limit deterioration of the film thickness uniformity and to control the film thickness uniformity. Particularly, by setting the film forming temperature to 750 degrees C. or lower, more desirably 700 degrees C. or lower, it is possible to limit a gas phase reaction and to make a surface reaction predominant. This makes it easy to secure the film thickness uniformity and to control the film thickness uniformity.

By supplying the DCS gas to the wafer 200 under the above-mentioned conditions, for example, a Si-containing layer containing Cl is formed with a thickness of about less than one atomic layer to several atomic layers (less than one molecular layer to several molecular layers), as a first layer on the outermost surface of the wafer 200. The Si-containing layer containing Cl may be a Si layer containing Cl, an adsorption layer of DCS, or both.

The Si layer containing Cl includes not only a continuous layer composed of Si and containing Cl but also a discontinuous layer or a Si thin film containing Cl formed by overlapping the continuous layer and the discontinuous layer. The Si constituting the Si layer containing Cl includes not only Si whose bond with Cl is not completely broken but also Si whose bond with Cl is completely broken.

The adsorption layer of DCS includes not only a continuous adsorption layer composed of DCS molecules but also a discontinuous adsorption layer. DCS molecules constituting the adsorption layer of DCS include those in which the bond between Si and Cl is partially broken. That is to say, the adsorption layer of DCS may include a physisorption layer of DCS, a chemisorption layer of DCS, or both.

In this regard, the layer having a thickness of less than one atomic layer (molecular layer) may mean an atomic layer (molecular layer) that is discontinuously formed. The layer having a thickness of one atomic layer (molecular layer) may mean an atomic layer that is continuously formed. The Si-containing layer containing Cl may include both a Si layer containing Cl and an adsorption layer of DCS. However, the Si layer containing Cl and the adsorption layer of DCS have the same structure in which Cl is bonded to a main element (Si). Therefore, for the sake of convenience, expressions such as "one atomic layer", "several atomic layers" and the like are used with respect to the Si-containing layer containing Cl. In some cases, the "atomic layer" may be synonymous with the "molecular layer."

Under a condition in which the DCS gas is autolyzed (pyrolized), Si is deposited on the wafer 200 to form a Si layer containing Cl. Under a condition in which the DCS gas is not autolyzed (pyrolized), DCS is adsorbed onto the wafer 200 to form an adsorption layer of DCS. From the viewpoint of increasing the film formation rate, it may be more preferable to form the Si layer containing Cl than to form the adsorption layer of DCS. Hereinafter, for the sake of convenience, the Si-containing layer containing Cl will be simply referred to as Si-containing layer.

If the thickness of the first layer exceeds several atomic layers, a modifying action in step B, which will be described later, does not affect the entire first layer. In addition, a minimum value of the thickness of the first layer is less than one atomic layer. Accordingly, the thickness of the first layer may preferably be from about less than one atomic layer to several atomic layers. By setting the thickness of the first layer to become one atomic layer or less, it is possible to relatively increase the modifying action in step B, which will be described later, and to shorten the time required for a modifying reaction in step B. It is also possible to shorten the time required for the formation of the first layer in step A. Consequently, it is possible to shorten the processing time per one cycle. This makes it possible to shorten the total processing time. That is to say, it is possible to increase the film formation rate. Furthermore, by setting the thickness of the first layer to become one atomic layer or less, it is possible to enhance the controllability of the film thickness uniformity.

Figure 5:
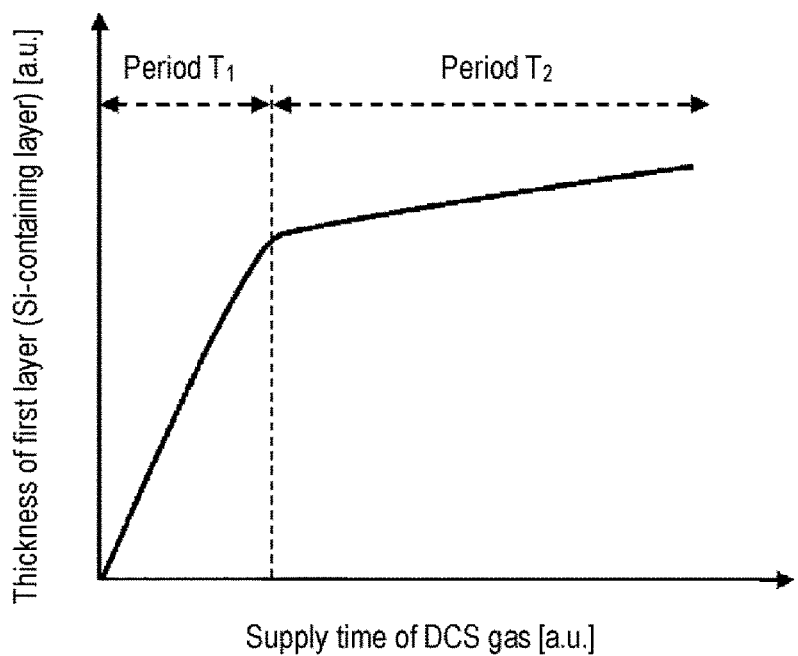
FIG. 5 is a diagram illustrating a change in a formation rate of a Si-containing layer on a substrate.

Here, since Si adsorption sites are abundantly present on the wafer 200 before supplying the DCS gas, the first layer is formed at a relatively large formation rate at the initial stage of the supply of the DCS gas. Then, as shown in FIG. 5, the large formation rate is maintained for a predetermined period (period $T_1$). Thereafter, if the formation of the first layer progresses and the amount of the adsorption sites existing on the wafer 200 decreases, a timing (inflection point) at which the formation rate of the first layer sharply drops is reached. After reaching the inflection point, the state in which the formation rate sharply drops is maintained during a period (period $T_2$) until the adsorption of DCS onto the wafer 200 is saturated.

At the initial stage of the above-described period $T_1$, the DCS gas supplied from the nozzle 249a is actively consumed in the peripheral edge portion of the wafer 200 and tends not to reach the central portion of the wafer 200. Therefore, for example, when the supply of the DCS gas to the wafer 200 is stopped before the inflection point is reached, the distribution of the thickness of the first layer in the plane of the wafer 200 (also referred to as the in-plane thickness distribution of the first layer) becomes a state in which the thickness of the first layer is smallest in a central portion of the wafer 200 and is gradually increased toward a peripheral edge portion of the wafer 200 (hereinafter also referred to as center concave distribution). At a point before the inflection point is reached and even after the inflection point is reached, by continuously supplying the DCS gas to the wafer 200 without stoppage, it is theoretically possible to shift the in-plane thickness distribution of the first layer from a center concave distribution to a flat distribution. This is because, by continuously supplying the DCS gas, the consumption of the DCS gas in the peripheral edge portion of the wafer 200 converges and, as a result, the amount of the DCS gas reaching the central portion of the wafer 200 gradually increases. However, in this method, it is necessary to continuously supply the DCS gas for a long period of time. This may lead to a case where the gas cost is increased or a case where the processing time per cycle is increased, thereby greatly damaging the productivity of a film forming process. Further, in the aforementioned method, it is theoretically possible to bring the in-plane thickness distribution of the first layer close to a flat distribution. However, it is difficult to convert the in-plane thickness distribution of the first layer to a center convex distribution.

When supplying the DCS gas to the wafer 200, by supplying the $N_2$ gas from the nozzles 249b and 249c at a large flow rate, it is possible to bring the in-plane thickness distribution of the first layer close to the flat distribution from the center concave distribution and to bring the in-plane thickness distribution of the first layer close to the center convex distribution. By controlling the $N_2$ gas in this manner, the pressure in an annular space in a plan view between the inner wall of the reaction tube 203 and the wafer 200 (hereinafter also simply referred to as "annular space") becomes higher than the pressure in the wafer arrangement region, namely the pressure in the spaces between the wafers 200. As a result, the outflow of the DCS gas to the annular space is suppressed, and the supply amount of the DCS gas to the central portion of the wafer 200 is increased. In addition, the partial pressure (concentration) of the DCS gas in the annular space decreases, and the supply amount of the DCS gas to the peripheral edge portion of the wafer 200 decreases. Thus, the in-plane thickness distribution of the first layer is controlled as described above. However, depending on the supply timing of the $N_2$ gas from the nozzles 249b and 249c and the flow rate thereof, the formation rate of the first layer may be reduced due to the dilution of the DCS gas, and the productivity of a film forming process may be greatly damaged. These are new problems which have become clear for the first time as a result of intensive research conducted by the present inventors.

In the present embodiment, in order to avoid the above-described various problems, in step A, the above-described steps A1 and A2 are performed in this order. Details of these steps will now be described.

In step A1, while supplying the DCS gas from the nozzle 249a, the valves 243d and 243c are opened to allow the $N_2$ gas to flow into the gas supply pipes 232d and 232c, thereby supplying the $N_2$ gas into the process chamber 201 from the nozzles 249b and 249c. Alternatively, in this step, the supply of the $N_2$ gas from the nozzles 249b and 249c may not be performed. However, it is preferable to supply the $N_2$ gas from the nozzles 249b and 249c in that the entry of the DCS gas into the nozzles 249b and 249c can be suppressed. In order to suppress the entry of the DCS gas into the nozzles 249b and 249c, it is preferable to start the supply of the $N_2$ gas from the nozzles 249b and 249c simultaneously with or before step A.

In step A1, each of the flow rates (first flow rates) of the $N_2$ gas supplied from the nozzles 249b and 249c is set to be smaller than the flow rate of the DCS gas supplied from the nozzle 249a. Preferably, each of the flow rates of the $N_2$ gas supplied from the nozzles 249b and 249c is set such that the total flow rate thereof is smaller than the flow rate of the DCS gas supplied from the nozzle 249a.

Dilution of the DCS gas supplied from the nozzle 249a in the process chamber 201 can be limited by setting each of the flow rates of the $N_2$ gas supplied from the nozzles 249b and 249c to such a small value. Thus, it is possible to perform the process of formation of the first layer on the wafer 200 at a relatively large formation rate (first rate). Each of the flow rates of the $N_2$ gas supplied from the nozzles 249b and 249c can be set to a predetermined flow rate within a range of, for example, 0 to 500 sccm. The execution time of step A1 may be set to, for example, ¼ to ½ of the execution time of step A.

In Step A, when step A1 is continuously performed, the formation rate of the first layer is changed from the above-described first rate to a second rate smaller than the first rate. Thus, step A1 is continued, and when or after the formation rate of the first layer is changed from the first rate to the second rate, step A2 of controlling the MFCs 241d and 241c while continuing (maintaining) the supply of the DCS gas from the nozzle 249a and increasing the flow rate of the $N_2$ gas supplied from the nozzles 249b and 249c starts. Further, when step A1 is continued, the forming rate of the first layer is sharply lowered to reach the inflection point. This is because the amount of adsorption sites existing on the wafer 200 decreases as described above.

In step A2, each of the flow rates (second flow rates) of the $N_2$ gas supplied from the nozzles 249b and 249c is set such that the total flow rate thereof is larger than the flow rate of the DCS gas supplied from the nozzle 249a. Preferably, each of the flow rates (second flow rates) of the $N_2$ gas supplied from the nozzles 249b and 249c is set such that the total flow rate thereof is larger than the total flow rate of the DCS gas and the $N_2$ gas supplied from the nozzle 249a. In addition, preferably, the flow rates of the $N_2$ gas supplied from the nozzles 249b and 249c are respectively set to be larger than the flow rate of the DCS gas supplied from the nozzle 249a. More preferably, the flow rates of the $N_2$ gas supplied from the nozzles 249b and 249c are respectively set to be larger than the total flow rate of the DCS gas and the $N_2$ gas supplied from the nozzle 249a.

By setting each of the flow rates of the $N_2$ gas supplied from the nozzles 249b and 249c to such a large value, the pressure in the annular space described above can be higher than the pressure in the spaces between the wafers 200, so that the amount of the DCS gas supplied to the central portion of the wafer 200 can be increased. Further, the partial pressure of the DCS gas in the annular space can be lowered, so that the supply amount of the DCS gas to the peripheral edge portion of the wafer 200 can be reduced. As a result, it becomes possible to bring the in-plane thickness distribution of the first layer close to the flat distribution from the center concave distribution or to bring the in-plane thickness distribution of the first layer close to the center convex distribution. The flow rates of the $N_2$ gas supplied from the nozzles 249b and 249c are respectively set to a predetermined flow rate within a range of, for example, 3000 to 6000 sccm. The execution time of step A2 may be, for example, ½ to ¾ of the execution time of step A. By setting the execution time of step A2 longer than the execution time of step A1, it is possible to increase the degree of the center convex distribution in the in-plane thickness distribution of the first layer.

After forming the first layer having the desired thickness and in-plane thickness distribution, the valve 243a is closed to stop the supply of the DCS gas. By controlling the MFCs 241d and 241c, each of the flow rates of the $N_2$ gas supplied from the nozzles 249b and 249c is changed from the second flow rate to the first flow rate or to the flow rate almost equal to the flow rate of the $N_2$ gas supplied from the nozzle 249a. At this time, while keeping the APC valve 244 opened, the interior of the process chamber 201 is vacuum-exhausted by the vacuum pump 246, whereby the DCS gas unreacted or contributed to the formation of the first layer, which remains in the process chamber 201, is removed from the interior of the process chamber 201. The $N_2$ gas supplied from the nozzles 249a to 249c acts as a purge gas, whereby the interior of the process chamber 201 is purged (purging step).

[Step B]

After step A is completed, an $NH_3$ gas is supplied to the wafer 200 in the process chamber 201, namely the first layer formed on the wafer 200.

In this step, the opening/closing control of the valves 243b and 243c to 243e is performed in the same procedure as the opening/closing control of the valves 243a and 243c to 243e in step A1. The flow rate of the $NH_3$ gas is adjusted by the MFC 241b. The $NH_3$ gas is supplied into the process chamber 201 through the nozzle 249b and is exhausted from the exhaust port 231a. At this time, the $NH_3$ gas is supplied to the wafer 200.

The supply flow rate of the $NH_3$ gas is set to a predetermined flow rate within a range of, for example, 1000 to 10000 sccm. The supply time of the $NH_3$ gas is set to a predetermined time within a range of, for example, 1 to 120 seconds, preferably 1 to 60 seconds. The supply flow rate of the $N_2$ gas supplied from each gas supply pipe is set to a predetermined flow rate within a range of, for example, 0 to 2000 sccm. The pressure in the process chamber 201 is set to a predetermined pressure within a range of, for example, 1 to 4000 Pa, preferably 1 to 3000 Pa. By setting the pressure in the process chamber 201 to such a relatively high pressure zone, it is possible to thermally activate the $NH_3$ gas in a non-plasma manner. The supply of the thermally activated $NH_3$ gas causes a relatively soft reaction, so that it is easy to form a second layer which will be described later. Other processing conditions are the same as the processing conditions in step A.

By supplying the NH$_3$ gas to the wafer 200 under the above-described conditions, at least a part of the first layer formed on the wafer 200 is nitrided (modified). By modifying the first layer, a second layer containing Si and N, namely a SiN layer is formed on the wafer 200. When forming the second layer, impurities such as Cl and the like contained in the first layer constitute a gaseous substance containing at least Cl in the course of the modifying reaction of the first layer using the NH$_3$ gas. The gaseous substance is discharged from the interior of the process chamber 201. In other words, impurities such as Cl and the like in the first layer are separated from the first layer by being pulled out or desorbed from the first layer. As a result, the second layer becomes a layer having a smaller amount of impurities such as Cl and the like than the first layer.

After the second layer is formed, the valve 243b is closed to stop the supply of the NH$_3$ gas. Then, according to the same processing procedures and processing conditions as in the purging step of step A, the NH$_3$ gas unreacted or contributed to the formation of the second layer, which remains in the process chamber 201, and the reaction byproducts are removed from the process chamber 201.

(Performing a Predetermined Number of Times)

A SiN film having a predetermined composition and a predetermined film thickness can be formed on the wafer 200 by performing, once or more (a predetermined number of times), a cycle which performs steps A and B non-simultaneously, i.e., asynchronously. The cycle described above is preferably repeated a plurality of times. That is to say, it is preferable that the thickness of the second layer formed when performing the above-described cycle once is set smaller than a desired film thickness, and the above-described cycle is repeated a plurality of times until the film thickness of the SiN film formed by laminating the second layer reaches a desired film thickness.

As a precursor, in addition to the DCS gas, it may be possible to use a chlorosilane precursor gas such as a monochlorosilane (SiH$_3$Cl, abbreviation: MCS) gas, a trichlorosilane (SiHCl$_3$, abbreviation: TCS) gas, a tetrachlorosilane (SiCl$_4$, abbreviation: STC) gas, a hexachlorodisilane (Si$_2$Cl$_6$, abbreviation: HCDS) gas, an octachlorotrisilane (Si$_3$Cl$_8$, abbreviation: OCTS) gas or the like.

As the reactant, in addition to the NH$_3$ gas, it may be possible to use, for example, a hydrogen-nitride-based gas such as a diazene (N$_2$H$_2$) gas, a hydrazine (N$_2$H$_4$) gas, an N$_3$H$_8$ gas or the like.

As the inert gas, in addition to the N$_2$ gas, it may be possible to use a rare gas such as an Ar gas, a He gas, an Ne gas, a Xe gas or the like.

(After-Purging to Atmospheric Pressure Restoration)

When the film having a desired composition and a desired film thickness is formed on the wafer 200, the N$_2$ gas as a purge gas is supplied from each of the nozzles 249a to 249c into the process chamber 201 and is exhausted from the exhaust port 231a. As a result, the interior of the process chamber 201 is purged, and the gas or reaction byproduct remaining in the process chamber 201 is removed from the process chamber 201 (after-purging). Thereafter, the atmosphere in the process chamber 201 is substituted with an inert gas (inert gas substitution), and the pressure in the process chamber 201 is restored to the atmospheric pressure (atmospheric pressure restoration).

(Boat Unloading and Wafer Discharging)

The seal cap 219 is lowered by the boat elevator 115 and the lower end of the manifold 209 is opened. Then, the processed wafers 200 are unloaded from the lower end of the manifold 209 to the outside of the reaction tube 203 in a state in which the processed wafers 200 are supported by the boat 217 (boat unloading). After the boat unloading, the shutter 219s is moved so that the lower end opening of the manifold 209 is sealed by the shutter 219s via the O-ring 220c (shutter closing). The processed wafers 200 are taken out to the outside of the reaction tube 203 and then discharged from the boat 217 (wafer discharging).

(3) Effects According to the Present Embodiment

According to the present embodiment, one or more effects described below may be achieved.

(a) By performing step A2 when supplying the DCS gas to the wafer 200, the in-plane film thickness distribution of the SiN film formed on the wafer 200 configured as a bare wafer can be set to a center convex distribution. Thus, when a pattern wafer is used as the wafer 200, it is possible to form a SiN film having a flat distribution on the wafer 200. In step A2, by setting each of the flow rates of the N$_2$ gas supplied from the nozzles 249b and 249c to be larger than the flow rate of the DCS gas supplied from the nozzle 249a, it is possible to more reliably realize the center convex distribution described above.

It is considered that the in-plane film thickness distribution of the film formed on the wafer 200 depends on the surface area of the wafer 200 due to a so-called loading effect. As the surface area of the wafer 200 to be subjected to film formation increases, a larger amount of precursor such as a DCS gas or the like is consumed in the peripheral edge portion of the wafer 200, making it difficult for the precursor to reach the central portion. As a result, the in-plane film thickness distribution of the film formed on the wafer 200 becomes a center concave distribution. According to the present embodiment, even when a pattern wafer having a large surface area is used as the wafer 200, it is possible to correct the in-plane film thickness distribution of the film formed on the wafer 200 from a center concave distribution to a flat distribution and to a center convex distribution. Thus, it is possible to freely control the in-plane film thickness distribution of the film formed on the wafer 200.

(b) By performing step A1 before step A2, it is possible to suppress the dilution of the DCS gas at the initial stage of formation of the first layer at which adsorption sites abundantly exist on the wafer 200. Thus, it is possible to form the first layer at a large formation rate. As a result, it is possible to increase the film formation rate of the SiN film and to improve the productivity of the film forming process. In step A1, by setting each of the flow rates of the N$_2$ gas supplied from the nozzles 249b and 249c to such a flow rate that the total flow rate thereof is smaller than the flow rate of the DCS gas supplied from the nozzle 249a, it is possible to further suppress the dilution of the DCS gas and to more reliably realize the above effect.

(c) By disposing the nozzles 249b and 249c on both sides of the nozzle 249a, it is possible to enhance the controllability of the in-plane thickness distribution of the first layer, i.e., the controllability of the in-plane film thickness of the SiN film formed on the wafer 200.

(d) By disposing the nozzles 249a to 249c so as to face the exhaust port 231a, it is possible to enhance the controllability of the in-plane thickness distribution of the first layer, i.e., the controllability of the in-plane film thickness distribution of the SiN film formed on the wafer 200.

(e) The above-described effects can be similarly obtained when a precursor other than the DCS gas is used, a reactant other than the $NH_3$ gas is used, or an inert gas other than the $N_2$ gas is used.

(4) Modifications

The film forming step according to the present embodiment may be changed as in the following modifications.
(Modification 1)

As described above, when step A1 is continued without performing step A2 in step A, the formation rate of the first layer is changed from a first rate to a second rate smaller than the first rate. In this modification, step A2 is started before the formation rate of the first layer is changed from the first rate to the second rate smaller than the first rate, preferably, before (immediately before) an inflection point is reached.

According to this modification, the start timing of step A2 that acts to bring the in-plane thickness distribution of the first layer close to the center convex distribution is advanced, and the execution period of step A1 that tends to bring the in-plane thickness distribution of the first layer to the center concave distribution is shortened. Thus, the in-plane film thickness distribution of the SiN film formed on the wafer 200 can be more reliably brought to the center convex distribution.
(Modification 2)

As the precursor, it may be possible to use, for example, an alkylhalosilane precursor gas such as 1,1,2,2-tetrachloro-1,2-dimethyldisilane (($CH_3)_2Si_2Cl_4$, abbreviation: TCDMDS) gas or the like, or an aminosilane precursor gas such as a trisdimethylaminosilane ($Si[N(CH_3)_2]_3H$, abbreviation: 3DMAS) gas, a bisdiethylaminosilane ($SiH_2[N(C_2H_5)_2]_2$, abbreviation: BDEAS) gas or the like. In addition, it may be possible to use a silane (silicon hydride) precursor gas such as a monosilane ($SiH_4$) gas, a disilane ($Si_2H_6$) or the like.

As the reactant, it may be possible to use, for example, an amine-based gas such as a triethylamine (($C_2H_5)_3N$, abbreviation: TEA) gas or the like, an O-containing gas (oxidizing agent) such as an oxygen ($O_2$) gas, a water vapor ($H_2O$), an ozone ($O_3$) gas, a plasma-excited $O_2$ gas ($O_2^*$), a combination of an $O_2$ gas and a hydrogen ($H_2$) gas or the like, a C-containing gas such as a propylene ($C_3H_6$) gas or the like, or a B-containing gas such as a trichloroborane ($BCl_3$) gas or the like.

For example, according to the following film forming sequences, a silicon oxynitride film (SiON film), a silicon oxycarbonitride film (SiOCN film), a silicon oxycarbide film (SiOC film), a silicon carbonitride film (SiCN film), a silicon boron carbonitride film (SiBCN film), a silicon boron nitride film (SiBN film) and a silicon oxide film (SiO film) may be formed on the wafer 200.

(DCS→$NH_3$→$O_2$)×n⇒SiON (DCS→TEA→$O_2$)×n⇒SiOC(N)

(DCS→$C_3H_6$→$NH_3$)×n⇒SiCN (DCS→$C_3H_6$→$NH_3$→$O_2$)×n⇒SiOCN (DCS→$C_3H_6$→$BCl_3$→$NH_3$)×n⇒SiBCN (DCS→$BCl_3$→$NH_3$)×n⇒SiBN (DCS→$O_2$+$H_2$)×n⇒SiO (3DMAS→$O_3$)×n⇒SiO (BDEAS→$O_2^*$)×n⇒SiO

In these film forming sequences, at the time of supplying the precursor, steps A1 and A2 are performed in the same manner as the film forming sequence shown in FIG. 4 or the film forming sequence of modification 1, whereby the same effects as described above can be obtained. The processing procedures and processing conditions when supplying the precursor or the reactant may be the same as those of the film forming sequence shown in FIG. 4 or the film forming sequence of modification 1.

Other Embodiments

The embodiment of the present disclosure has been concretely described above. However, the present disclosure is not limited to the above-described embodiment. Various modifications may be made without departing from the spirit of the present disclosure.

In the above-described embodiment, there has been described an example where the second nozzle includes the nozzles 249b and 249c which are disposed on both sides of the nozzle 249a as the first nozzle. However, the present disclosure is not limited to such an embodiment. For example, the second nozzle may include only the nozzle 249b, and the nozzle 249b may be disposed close to or apart from the nozzle 249a. Even in this case, the same effects as described above can be obtained by performing steps A1 and A2 in the same manner as the film forming sequence shown in FIG. 4 and modifications 1 and 2 at the time of supplying the precursor. However, the nozzle arrangement in the above-described embodiment is preferable in that the controllability of the in-plane film thickness distribution of the film formed on the wafer 200 can be enhanced.

In the above-described embodiment, there has been described an example where steps A1 and A2 are performed at the time of supplying the precursor. However, the present disclosure is not limited to such an aspect. For example, steps A1 and A2 may be performed at the time of supplying the reactant and not at the time of supplying the DCS gas. In this case, it is possible to control the concentration distribution of N, C, O, B and the like in the film formed on the wafer 200 in the plane of the wafer 200. Steps A1 and A2 performed at the time of supplying the reactant may be performed by the same processing conditions and processing procedures as those of the film forming sequence shown in FIG. 4 or steps A1 and A2 of modifications 1 and 2.

In the above-described embodiment, there has been described an example where the reactant such as an $NH_3$ gas or the like is supplied from the nozzle 249b. However, the present disclosure is not limited to such an embodiment. For example, the reactant may be supplied from the nozzles 249b and 249c. Furthermore, nozzles different from the nozzles 249a to 249c may be newly provided in the process chamber 201, and the reactant may be supplied using the newly provided nozzles. Even in these cases, the same effects as described above can be obtained by performing steps A1 and A2 in the same manner as the film forming sequence shown in FIG. 4 and modifications 1 and 2 at the time of supplying the precursor.

In the above-described embodiment, there has been described an example where a film containing Si as a main element is formed on the substrate. However, the present disclosure is not limited to such an aspect. That is to say, the present disclosure may be suitably applied to a case where a film containing not only Si but also a semimetal element such as germanium (Ge), boron (B) or the like as a main element is formed on the substrate. The present disclosure may also be suitably applied to a case where a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like as a main element is formed on the substrate.

The present disclosure may be suitably applied to a case where, by using, for example, a titanium tetrachloride (TiCl$_4$) gas or a trimethylaluminum (Al(CH$_3$)$_3$, abbreviation: TMA) gas as a precursor, a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), a titanium oxide film (TiO film) or the like is formed on a substrate according to the following film forming sequences.

(TiCl$_4$→NH$_3$)×$n$⇒TiN

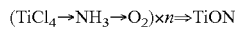
(TiCl$_4$→NH$_3$→O$_2$)×$n$⇒TiON

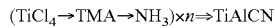
(TiCl$_4$→TMA→NH$_3$)×$n$⇒TiAlCN

(TiCl$_4$→TMA)×$n$⇒TiAlC

(TiCl$_4$→TEA)×$n$⇒TiCN

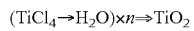
(TiCl$_4$→H$_2$O)×$n$⇒TiO$_2$

It is preferable that the recipes used for substrate processing are individually prepared according to the processing contents and stored in the memory device 121c via the electric communication line or the external memory device 123. When starting a process, it is preferable that the CPU 121a appropriately selects an appropriate recipe from the plurality of recipes stored in the memory device 121c according to the substrate processing contents. This makes it possible to form films of various film types, composition ratios, film qualities and film thicknesses with high reproducibility in one substrate processing apparatus. It is also possible to reduce the burden on an operator and to quickly start the process while avoiding operation errors.

The above-described recipes are not limited to the case of newly creating recipes, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, by operating the input/output device 122 provided in the existing substrate processing apparatus, the existing recipes already installed in the substrate processing apparatus may be directly changed.

Figure 6A:
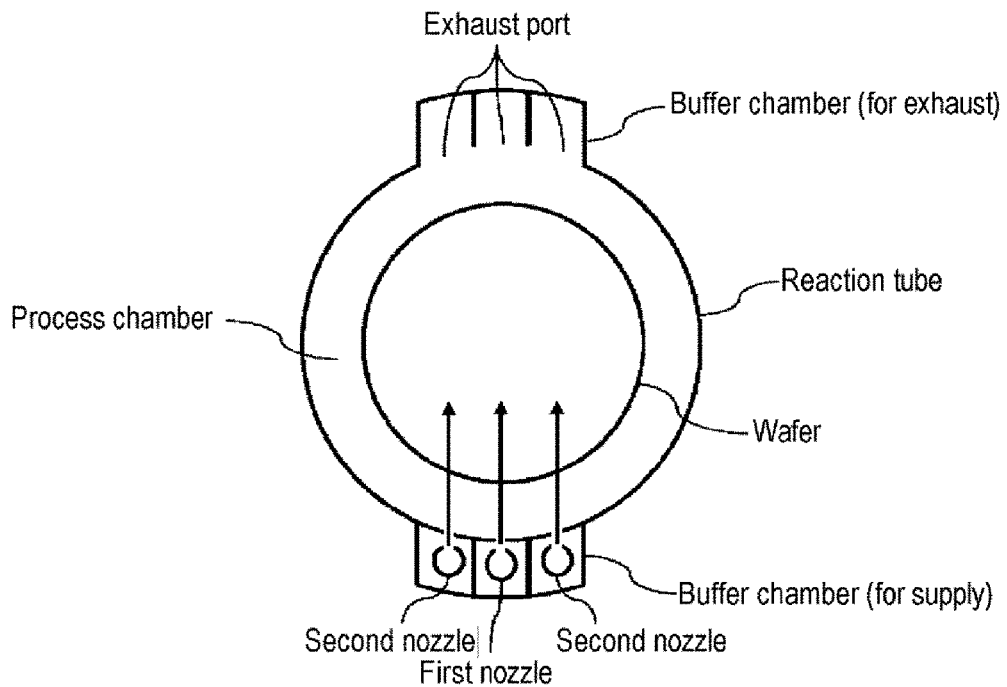
FIGS. 6A and 6B are horizontal sectional views showing modifications of a vertical processing furnace, respectively, in which a reaction tube, a buffer chamber, a nozzle and the like are shown in a partially extracted state.
Figure 6B:
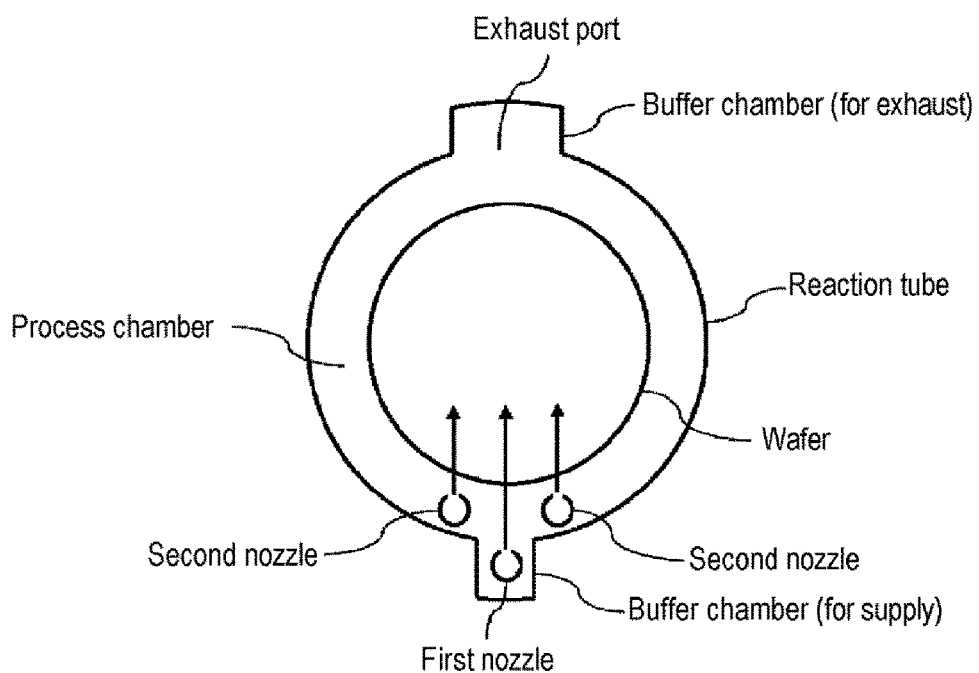

In the above-described embodiment, there has been described an example in which the first and second nozzles are provided in the process chamber so as to extend along the inner wall of the reaction tube. However, the present disclosure is not limited to the embodiment described above. For example, as can be noted from the cross-sectional structure of the vertical processing furnace shown in FIG. 6A, a buffer chamber may be provided in the side wall of the reaction tube, and first and second nozzles having the same configuration as in the above-described embodiment may be arranged in the same arrangement as in the above-described embodiment. In FIG. 6A, there is shown an example where a supply-purpose buffer chamber and an exhaust-purpose buffer chamber are provided in the side wall of the reaction tube and are disposed at positions facing each other across the wafers. In addition, FIG. 6A shows an example where the supply-purpose buffer chamber is partitioned into a plurality of (three) spaces, and individual nozzles are disposed in the respective spaces. The arrangement of the three spaces of the buffer chamber is the same as the arrangement of the first and second nozzles. Furthermore, for example, as can be noted from the cross-sectional structure of the vertical processing furnace shown in FIG. 6B, a buffer chamber may be provided in the same arrangement as in FIG. 6A, a first nozzle may be provided in the buffer chamber, and second nozzles may be provided so as to be placed on both sides of the communication portion of the buffer chamber with the process chamber and so as to extend along the inner wall of the reaction tube. The configurations other than the reaction tube described with reference to FIGS. 6A and 6B are the same as the configurations of the respective parts of the processing furnace shown in FIG. 1. Even when these processing furnaces are used, the effects similar to those of the above-described embodiment can be obtained.

In the above-described embodiment, there has been described an example where a film is formed using a batch-type substrate processing apparatus that processes a plurality of substrates at a time. The present disclosure is not limited to the above-described embodiment, but may be suitably applied to, for example, a case where a film is formed using a single-wafer type substrate processing apparatus that processes one or several substrates at a time. Furthermore, in the above-described embodiment, there has been described an example where a film is formed using a substrate processing apparatus including a hot wall-type processing furnace. The present disclosure is not limited to the above-described embodiment, but may be suitably applied to a case where a film is formed using a substrate processing apparatus including a cold wall-type processing furnace.

Even in the case of using these substrate processing apparatuses, film formation can be performed under the same sequences and processing conditions as those of the above-described embodiment and modifications, and the same effects as described above can be obtained.

Further, the above-described embodiment and modifications may be used in combination as appropriate. The processing procedures and processing conditions at this time may be the same as, for example, the processing procedures and processing conditions of the above-described embodiment.

The SiN film or the like formed by the methods of above-described embodiment and modifications may be widely used as an insulating film, a spacer film, a mask film, a charge storage film, a stress control film, or the like. In recent years, along with the miniaturization of semiconductor devices, the requirement for in-plane film thickness uniformity on films formed on wafers has become severe. It is considered that the present disclosure capable of forming a film having a flat distribution on a pattern wafer on which a high density pattern is formed is very useful as a technique for complying with this requirement.

EXAMPLE

Hereinafter, experimental results that support the effects obtained in the above-described embodiment will be described.

In an example, using the substrate processing apparatus shown in FIG. 1, SiN films were respectively formed on a plurality of wafers according to a film forming sequence shown in FIG. 4. As the wafers, a bare wafer not having a concavo-convex structure on its surface and a pattern wafer having a concavo-convex structure on its surface were used. As the pattern wafer, a wafer whose major surface (a base for a film forming process) has a surface area 20 to 25 times as large as the surface area of the major surface of the bare wafer was used. Other processing conditions were set to predetermined conditions falling within the processing condition ranges described in the above embodiment.

In comparative example 1, using the substrate processing apparatus shown in FIG. 1, SiN films were respectively formed on a plurality of wafers according to a film formation sequence in which step A of supplying a DCS gas to the wafers and step B of supplying an $NH_3$ gas to the wafers are alternately repeated. However, in comparative example 1, only step A1 was performed and step A2 was not performed while performing step A. Step A1 was performed from the start to the end of step A. Other processing conditions are the same as those of the example.

In comparative example 2, using the substrate processing apparatus shown in FIG. 1, SiN films were respectively formed on a plurality of wafers according to a film formation sequence in which step A of supplying a DCS gas to the wafers and step B of supplying an $NH_3$ gas to the wafers are alternately repeated. However, in comparative example 2, only step A2 was performed and step A1 was not performed while performing step A. Step A2 was performed from the start to the end of step A. Other processing conditions are the same as those of the example.

Figure 7A:
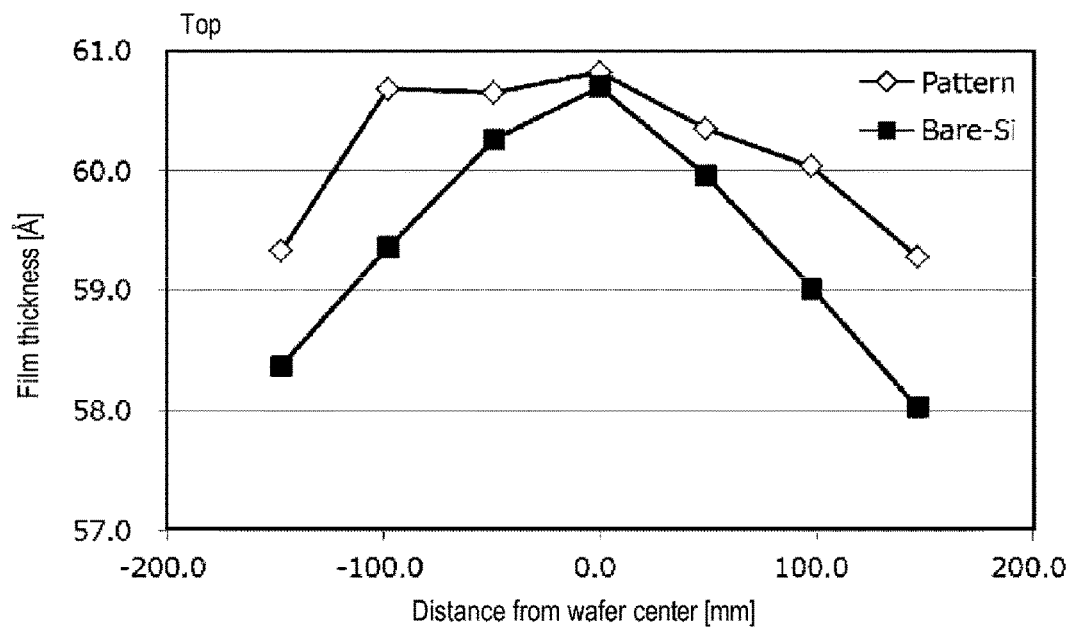
FIGS. 7A to 7C are diagrams showing evaluation results of the in-plane film thickness distribution of a film formed on a substrate.
Figure 7B:
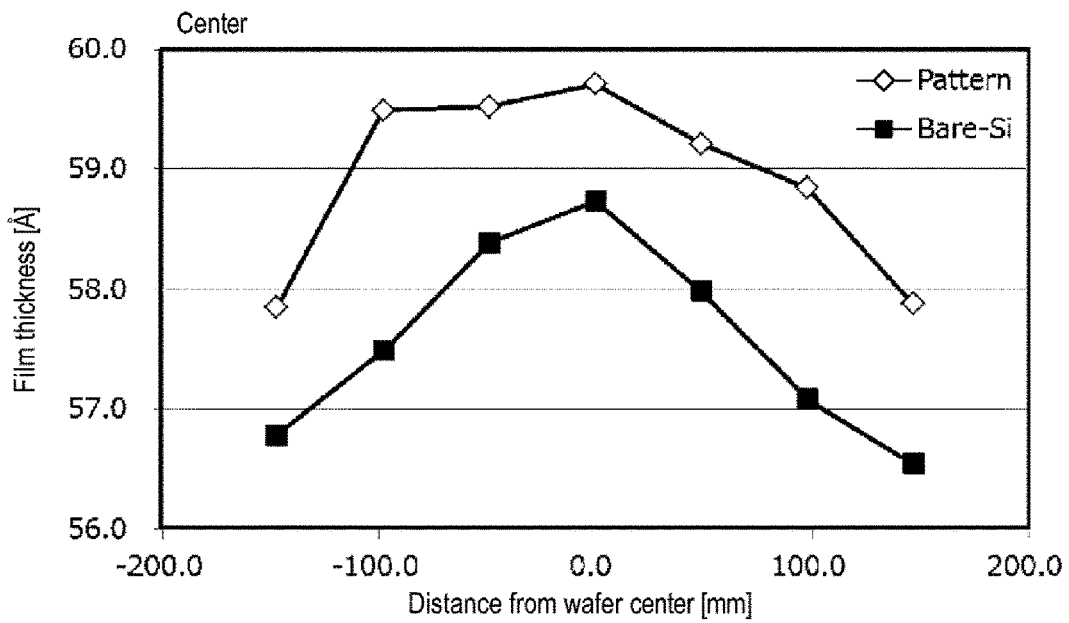
Figure 7C:
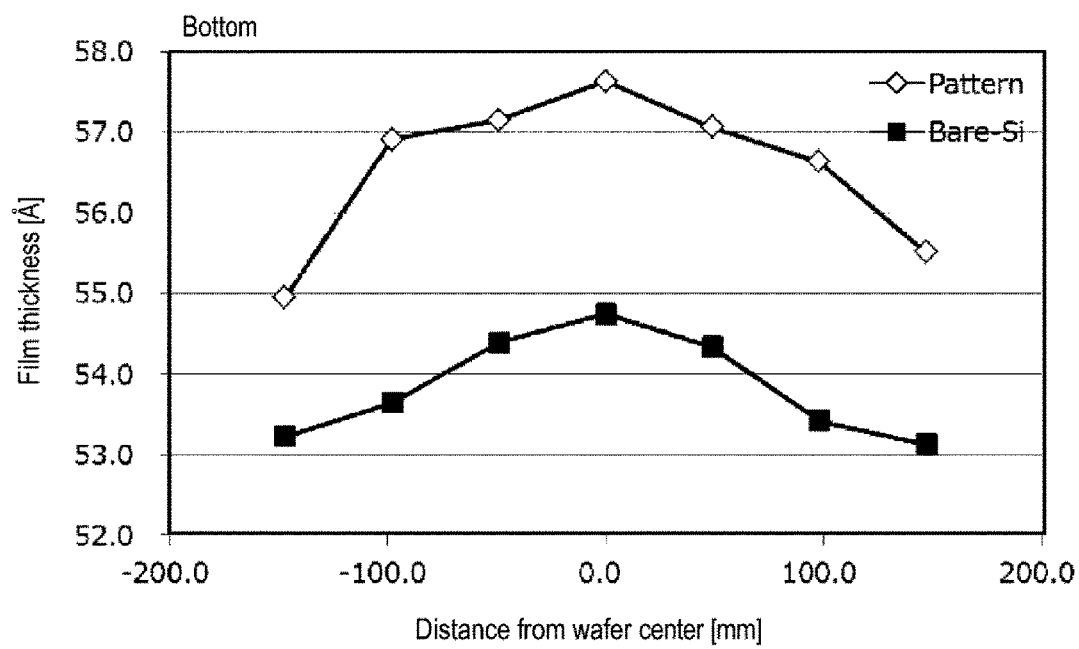
Figure 8A:
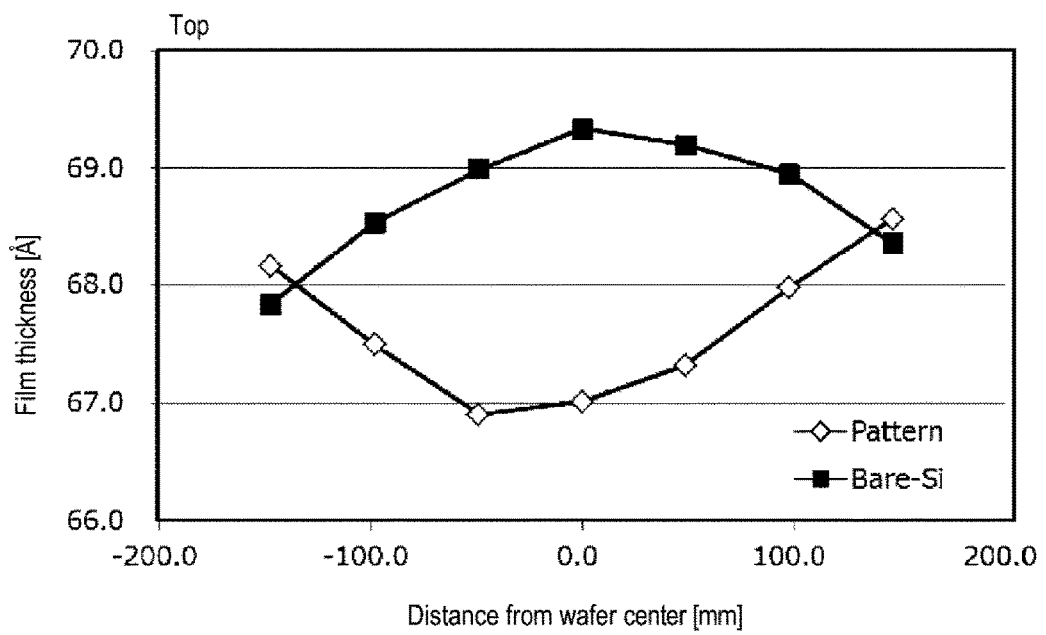
FIGS. 8A to 8C are diagrams showing evaluation results of the in-plane film thickness distribution of a film formed on a substrate.
Figure 8B:
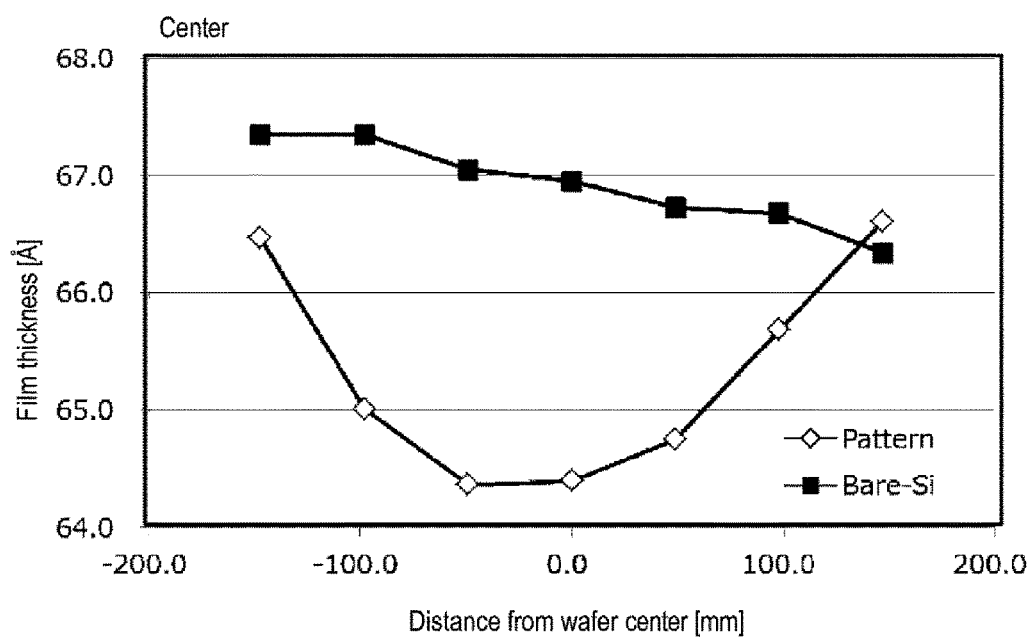
Figure 8C:
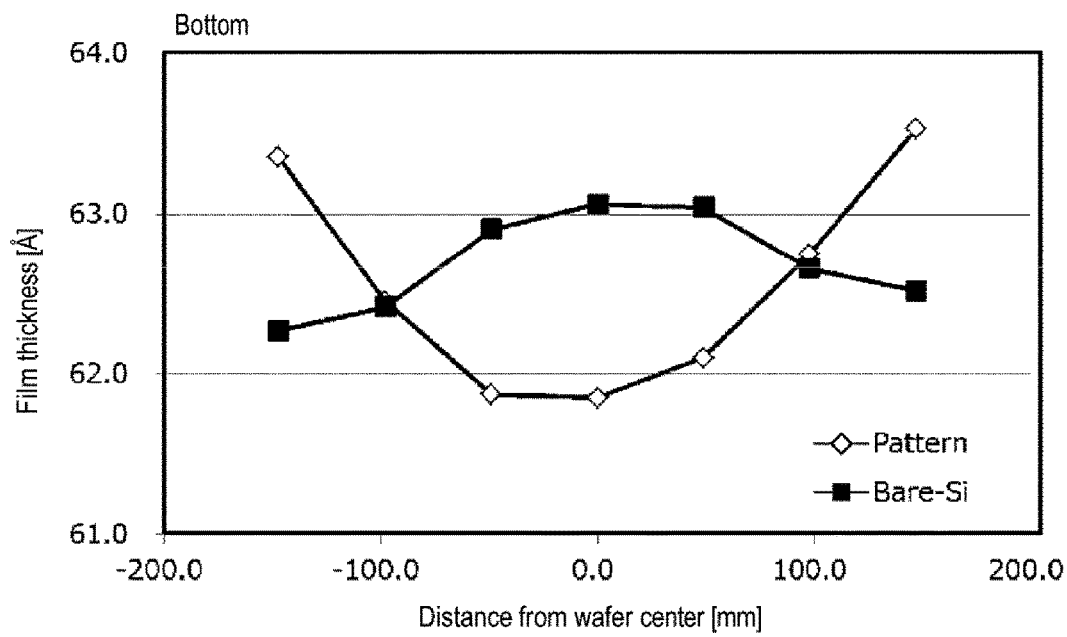
Figure 9A:
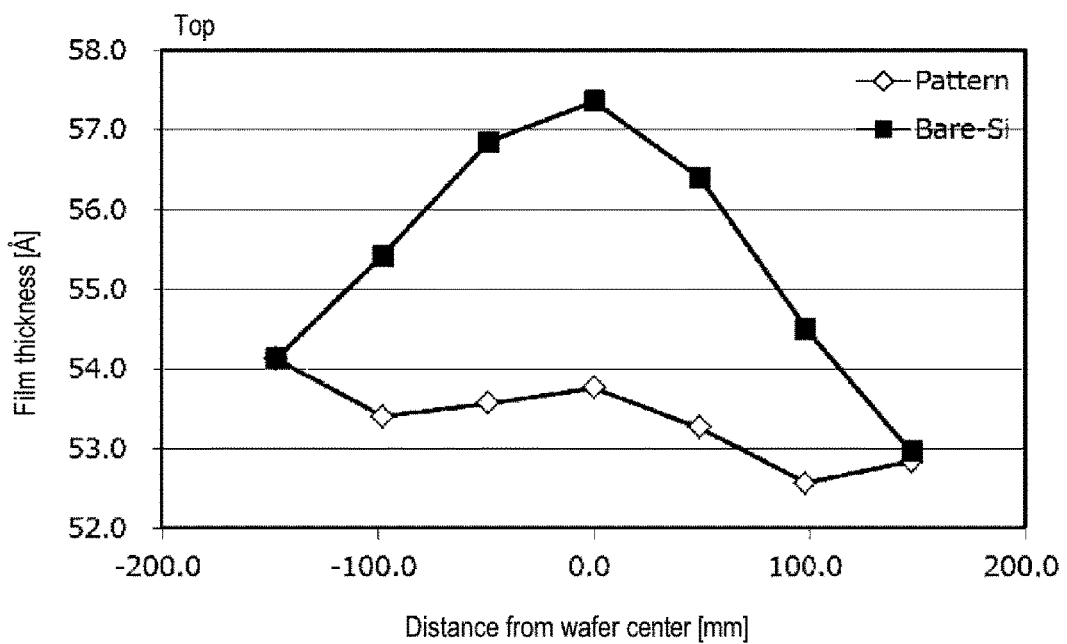
FIGS. 9A to 9C are diagrams showing evaluation results of the in-plane film thickness distribution of a film formed on a substrate.
Figure 9B:
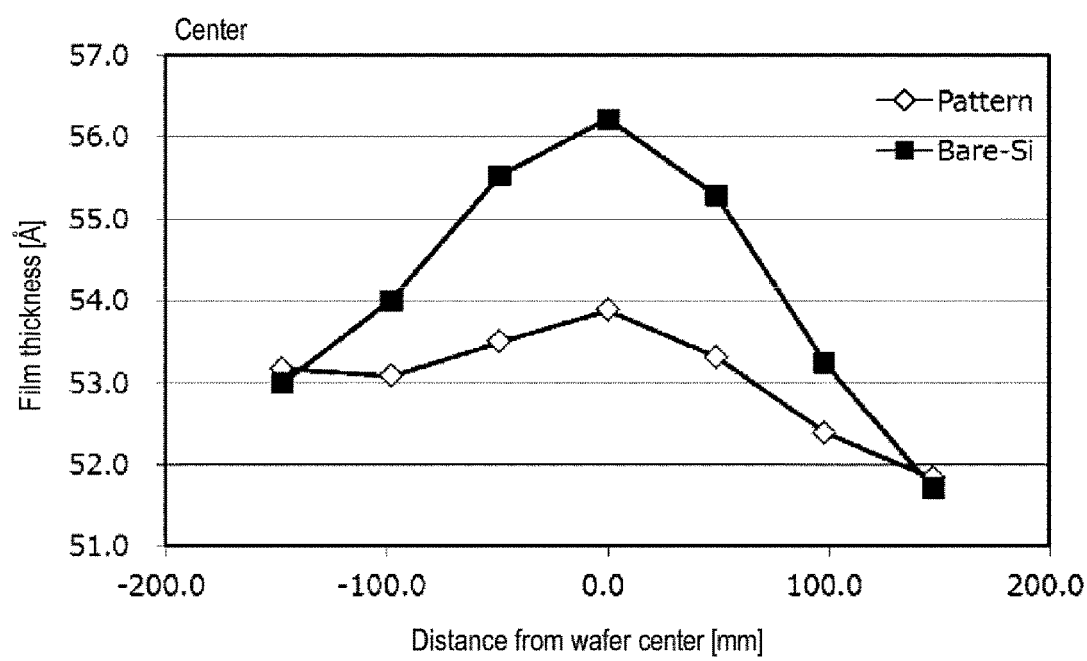
Figure 9C:
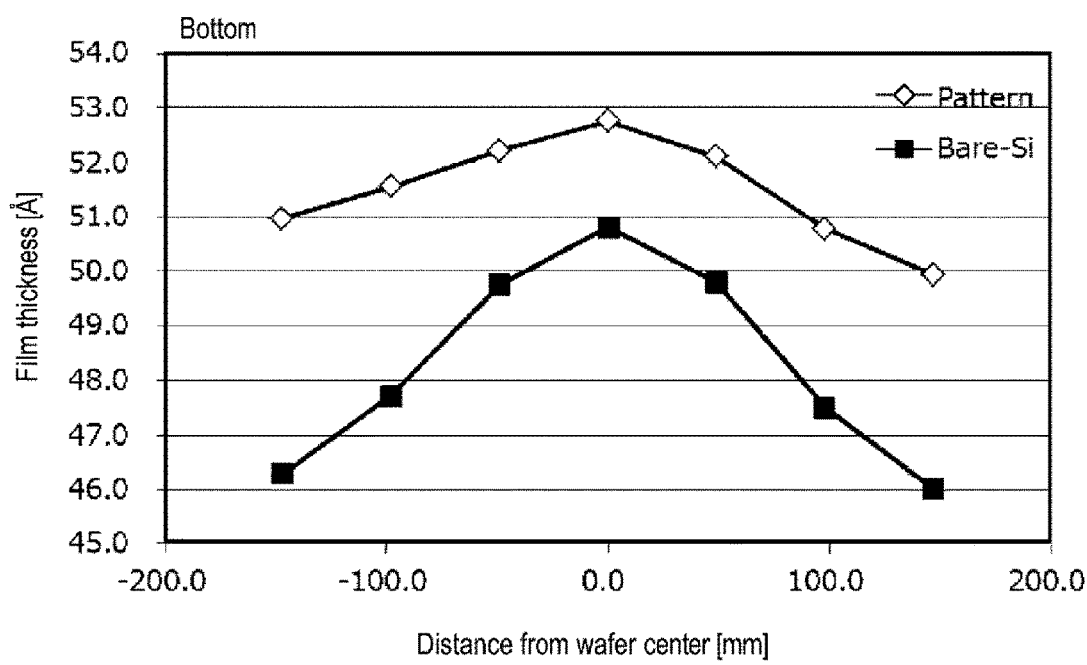

Then, the in-plane film thickness distributions of the SiN films formed in the example and comparative examples 1 and 2 were measured. FIGS. 7A to 7C show the measurement results of the example, FIGS. 8A to 8C show the measurement results of comparative example 1, and FIGS. 9A to 9C show the measurement results of comparative example 2. In each figure, the terms "Top", "Center" and "Bottom" indicate the positions of the wafer in the wafer arrangement region. The vertical axis of each figure indicates the film thickness [Å], and the horizontal axis indicates the distance [mm] of the measurement position from the center of the wafer. In the figures, the mark "■" indicates the measurement result of the SiN film formed on the bare wafer, and the mark "◇" indicates the measurement result of the SiN film formed on the pattern wafer.

According to FIGS. 7A to 7C, it can be understood that the in-plane film thickness distribution of the SiN films formed on the bare wafers is a center convex distribution. In addition, it can be seen that the in-plane film thickness distribution of the SiN films formed on the pattern wafers is a relatively gentle center convex distribution. In other words, it can be noted that, by sequentially performing steps A1 and A2 in step A as in the example, it is possible to bring the in-plane film thickness distribution of the SiN films formed on the pattern wafers close to a flat distribution, for example, to a relatively gentle center convex distribution.

According to FIGS. 8A to 8C, it can be seen that the in-plane film thickness distribution of the SiN films formed on the bare wafers is either a weak center convex distribution or a distribution close to a flat distribution. It can also be noted that the in-plane film thickness distribution of the SiN films formed on the pattern wafers is a center concave distribution. That is to say, it can be seen that, when step A2 is not performed in step A as in comparative example 1, it is difficult to set the in-plane film thickness distribution of the SiN films formed on the pattern wafers to a flat distribution or a center convex distribution.

According to FIGS. 9A to 9C, it can be understood that the in-plane film thickness distribution of the SiN films formed on the bare wafers is a center convex distribution. It can also be seen that the in-plane film thickness distribution of the SiN films formed on the pattern wafers is a relatively gentle center convex distribution although partially thick in the outer periphery at the top. That is to say, it can be noted that, by performing step A2 in step A as in comparative example 2, it is possible to bring the in-plane film thickness distribution of the SiN films formed on the pattern wafers close to a flat distribution, for example, to a relatively gentle center convex distribution. However, it can be understood that the SiN films formed in comparative example 2 has a smaller film thickness than the SiN films formed in the example. This is probably because, by not performing step A1 before step A2, the DCS gas is diluted immediately after starting step A, and the film formation rate is lowered. That is to say, it can be seen that, when step A1 is not performed prior to step A2 as in comparative example 2, it is difficult to improve the productivity of the film forming process as in the example.

It can be noted that film thickness uniformity between wafers (hereinafter also referred to as WtW) of the SiN films formed on the bare wafer of comparative example 2 is poor as compared with the SiN films formed on the bare wafers of comparative example 1. In contrast, it can be seen that the SiN films formed on the pattern wafers of comparative example 2 has better WtW than the SiN films formed on the pattern wafers of comparative example 1. That is to say, it can be understood that in comparative example 2, even if the WtW of the SiN films formed on the bare wafers is improved, it is difficult to improve the WtW of the SiN films formed on the pattern wafers so as to follow the WtW of the SiN films formed on the bare wafers. As described above, in comparative example 2, there may be a case where the tendency of the WtW of the SiN films formed on the bare wafers and the pattern wafers is inconsistent with each other, which may cause trouble during product management.

Furthermore, it can be understood that, in the SiN films formed on the pattern wafers of comparative example 2, the degree of the center convex distribution greatly differs among the Top, the Center and the Bottom, the degree is relatively small at the Top, and the degree is relatively large at the Bottom. However, it is preferable that the degree of the center convex distribution is essentially uniform among the Top, the Center and the Bottom. In comparative example 2, even if the tendency of the center convex distribution of the SiN films formed on the bare wafers is made uniform among the Top, the Center and the Bottom, it is difficult for the center convex distribution of the SiN films formed on the pattern wafers to have the same tendency, which may cause trouble during product management.

On the other hand, in the example, it is possible to resolve the problems of comparative example 2.

For example, in the example, by improving the WtW of the SiN films formed on the bare wafers, it is possible to improve the WtW of the SiN films formed on the pattern wafers so as to follow the WtW of the SiN films formed on the bare wafers. That is to say, in the example, it is possible to match the tendencies of the in-plane film thickness distribution of the SiN films formed on the bare wafers and the SiN films formed on the pattern wafers. This is convenient for product management.

Furthermore, in the example, by changing the in-plane film thickness distribution of the SiN films formed on the bare wafers, the in-plane film thickness distribution of the SiN films formed on the pattern wafers can be evenly changed among the Top, the Center and the Bottom. In other words, in the example, by improving the degree of the center convex distribution of the SiN films formed on the bare wafers, the degree of the center convex distribution of the SiN films formed on the pattern wafers can be evenly improved among the Top, the Center and the Bottom. This is also convenient for product management.

In FIGS. 7A to 7C, there is illustrated a case where the film thickness distribution of the SiN films formed on the pattern wafers is set to a gentle center convex distribution. However, the present disclosure is not limited to such an aspect. For example, in the example, by setting the flow rate (second flow rate) of the $N_2$ gas supplied in step A2 to a side of a lower flow rate, the film thickness distribution of the SiN film formed on the pattern wafer can be set to a flat distribution. That is to say, by appropriately increasing or decreasing (adjusting) the flow rate (second flow rate) of the $N_2$ gas supplied in step A2 depending on the surface area of the wafer, it is possible to set the film thickness distribution of the SiN film to a flat distribution. For example, by setting the second flow rate to a small value when the surface area of the pattern wafer is relatively small or setting the second flow rate to a large value when the surface area of the pattern wafer is relatively large, namely by adjusting the magnitude of the second flow rate depending on the surface area of the wafer, it is possible to set the film thickness distribution of the SiN film formed on the wafer to a flat distribution.

According to the present disclosure in some embodiments, it is possible to control the in-plane film thickness distribution of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a film on a substrate by performing a cycle a predetermined number of times, the cycle including non-simultaneously performing:
   (a) forming a first layer by supplying a precursor including halosilane to the substrate from a first nozzle; and
   (b) forming a second layer by supplying a reactant to the substrate from a second nozzle different from the first nozzle to thereby modify the first layer,
   wherein the act (a) includes sequentially performing:
   (a-1) supplying an inert gas from the second nozzle at a first flow rate smaller than a flow rate of the precursor in a state in which the precursor is supplied from the first nozzle; and
   (a-2) supplying an inert gas from the second nozzle at a second flow rate larger than the flow rate of the precursor in a state in which the precursor is supplied from the first nozzle,
   wherein in the act (a-1), a formation rate of the first layer is changed from a first rate to a second rate smaller than the first rate, and the act (a-2) is started when or after the formation rate of the first layer is changed to the second rate, and
   wherein the act (a-2) is not performed when the formation rate of the first layer is the first rate.

2. The method of claim 1, wherein when the act (a-1) is continuously performed without performing the act (a-2), the formation rate of the first layer is changed from the first rate to the second rate.

3. The method of claim 1, wherein in the act (a-2), the inert gas is supplied together with the precursor from the first nozzle, and the second flow rate is set to be larger than a total flow rate of the precursor and the inert gas, which are supplied from the first nozzle.

4. The method of claim 1, wherein the second nozzle includes a plurality of nozzles which are disposed on both sides of the first nozzle such that the first nozzle is interposed between the plurality of nozzles.

5. The method of claim 4, wherein in the act (a-1), each of flow rates of inert gases respectively supplied from the plurality of nozzles is set to be smaller than the flow rate of the precursor.

6. The method of claim 5, wherein in the act (a-2), each of the flow rates of the inert gases respectively supplied from the plurality of nozzles is set to be larger than the flow rate of the precursor.

7. The method of claim 6, wherein when the act (a-1) is continuously performed without performing the act (a-2), the formation rate of the first layer is changed from the first rate to the second rate.

8. The method of claim 5, wherein in the act (a-2), the inert gas is supplied together with the precursor from the first nozzle, and each of the flow rates of the inert gases respectively supplied from the plurality of nozzles is set to be larger than a total flow rate of the precursor and the inert gas supplied from the first nozzle.

* * * * *